United States Patent [19]

Nakabayashi et al.

[11] Patent Number: 5,365,407
[45] Date of Patent: Nov. 15, 1994

[54] DC POWER SUPPLY DEVICE WITH PRINTED-CIRCUIT BOARD HAVING GROUND PATTERN

[75] Inventors: Toshiya Nakabayashi, Tokyo; Hirokazu Nakayoshi, Kanagawa; Kazuo Hashimoto, Tokyo, all of Japan

[73] Assignee: Sony Corporation, Japan

[21] Appl. No.: 9,988

[22] Filed: Jan. 27, 1993

[30] Foreign Application Priority Data

Feb. 7, 1992 [JP] Japan .................................. 4-022839

[51] Int. Cl.$^5$ ...................... H05K 1/11; H01R 13/648
[52] U.S. Cl. ........................................ 361/794; 174/51;
174/255; 174/35 R; 361/760; 361/795;
361/792; 361/793; 361/809; 361/818; 439/47;
439/109; 439/608
[58] Field of Search .............. 174/51, 250, 255, 35 R,
174/262; 257/659, 700; 361/760, 762, 780, 792,
793, 794, 795, 807, 809, 818; 428/901, 206, 209;
439/44, 45, 47, 48, 50, 68, 69, 74, 109, 607, 608

[56] References Cited

U.S. PATENT DOCUMENTS

| | | | |
|---|---|---|---|
| 3,162,931 | 12/1964 | Gessner | 174/255 |
| 3,484,697 | 12/1969 | Abend | 174/262 |
| 4,675,789 | 6/1987 | Kuwabara et al. | 361/794 |
| 4,677,254 | 6/1987 | Boss et al. | 174/255 |
| 4,799,128 | 1/1989 | Chen | 361/794 |
| 4,984,132 | 1/1991 | Sakurai et al. | 361/794 |
| 5,073,840 | 12/1991 | Coors | 174/255 |

FOREIGN PATENT DOCUMENTS

| | | | |
|---|---|---|---|
| 2-16796 | 1/1990 | Japan | 174/35 R |
| 2039153 | 7/1980 | United Kingdom | 361/795 |

OTHER PUBLICATIONS

"Multiple LSI Silicon Chip Modules With Power Buses Composed of Laminated Silicon Sheets With Metallized Upper and Lower Surfaces" IBM Technical Disclosure Bulletin vol. 22 No. 8A Jan. 1980.

Primary Examiner—Leo P. Picard
Assistant Examiner—Donald A. Sparks
Attorney, Agent, or Firm—Ronald P. Kananen

[57] ABSTRACT

A DC power supply device for use with a video tape recorder with a built-in camera has a plurality of power supply blocks for supplying a plurality of voltages, each of the power supply blocks being composed of a switching circuit for being supplied with a DC voltage and a smoothing circuit connected to an output terminal of the switching circuit. The power supply blocks are mounted on a multilayer circuit board which includes a layer of a ground pattern with an electric conductor extending substantially fully thereover, the ground pattern being separated into a plurality of ground pattern portions by a plurality of recesses defined therein, the power supply blocks having respective ground terminals connected to the ground pattern portions, respectively. The multilayer circuit board may comprise at least a layer for mounting electronic parts thereon, a layer having a signal line pattern thereon, a layer having a power supply line pattern thereon, in addition to the layer of the ground pattern, and a plurality of insulating layers electrically separating and mechanically joining the layers.

3 Claims, 2 Drawing Sheets

DC POWER SUPPLY DEVICE WITH PRINTED-CIRCUIT BOARD HAVING GROUND PATTERN

BACKGROUND OF THE INVENTION

1. Field of the Invention

The present invention relates to a DC power supply device for use with an apparatus such as a video tape recorder with a built-in camera or the like which needs a plurality of DC voltages.

2. Description of the Prior Art

DC power supplies for use with video tape recorders with built-in cameras are typically arranged to supply a voltage of 5 V to a video system, a voltage of 9 V to a camera system, a voltage of 1.5 V to a drum system, and a voltage of 2 V to a capstan system. One conventional circuit arrangement of such DC power supplies is designed so as not to suffer from load variations as shown in FIG. 1 of the accompanying drawings.

As shown in FIG. 1, the conventional DC power supply has an input terminal 1 for being supplied with a DC voltage of 10 V, for example, a video system power supply block 2, a camera system power supply block 3, a drum system power supply block 4, a capstan system power supply block 5, a video system output terminal 2c, a camera system output terminal 3c, a drum system output terminal 4c, a capstan system output terminal 5c, and a control circuit 6. The video system power supply block 2 has a video system power supply switching circuit 2a having an input terminal supplied with the DC voltage of 10 V from the input terminal 1. The camera system power supply block 3 has a camera system power supply switching circuit 3a having an input terminal supplied with the DC voltage of 10 V from the input terminal 1. The drum system power supply block 4 has a drum system power supply switching circuit 4a having an input terminal supplied with the DC voltage of 10 V from the input terminal 1. The capstan system power supply block 5 has a capstan system power supply switching circuit 5a having an input terminal supplied with the DC voltage of 10 V from the input terminal 1. The DC voltage of 10 V from the input terminal 1 is also applied to the control circuit 6 which comprises an integrated circuit.

The switching circuits 2a, 3a, 4a, 5a turn on and off the supplied DC voltage with switching signals of a frequency of about 500 kHz or lower from the control circuit 6, and supply the switched voltages to respective smoothing circuits 2b, 3b, 4b, 5b of the respective blocks 2, 3, 4, 5.

The control circuit 6 compares DC voltages of 5 V, 9 V, 1.5 V, 2 V from respective output terminals of the smoothing circuits 2b, 3b, 4b, 5b with respective predetermined reference voltages, e.g., a voltage of 5 V for the video system power supply block 2, a voltage of 9 V for the camera system power supply block 3, a voltage of 1.5 V for the drum system power supply block 4, and a voltage of 2 V for the capstan system power supply block 5. The control circuit 6 produces switching signals having pulse durations depending on the differences between the compared voltages, and supplies the produced switching signals to the respective smoothing circuits 2b, 3b, 4b, 5b.

The DC voltages of 5 V, 9 V, 1.5 V, 2 V from the respective output terminals of the smoothing circuits 2b, 3b, 4b, 5b are supplied respectively to the video system output terminal 2c, the camera system output terminal 3c, the drum system output terminal 4c, the capstan system output terminal 5c.

The circuit arrangement shown in FIG. 1 has been mounted on a double-sided circuit board, and the switching signals have had a frequency of 500 kHz or lower. Therefore, ripples, spike voltages, and undesirable radiations can be suppressed to a certain extent by suitably designed wiring patterns on the double-sided circuit board.

However, if the switching signals supplied from the control circuit 6 to the switching circuits 2a, 3a, 4a, 5a have a higher frequency ranging from 1 MHz to 1.2 MHz, for example, in an effort to reduce the size of the DC power supply device, then ripples, spike voltages, and undesirable radiations in the circuit on the double-sided circuit board can be suppressed, but tend to interfere with each other, adversely affecting signal lines and other circuits.

To avoid the above shortcomings, it may be possible to employ large-size capacitors and coils in the DC power supply device. However, use of such large-size capacitors and coils results in an increase in the size of the DC power supply device.

OBJECTS AND SUMMARY OF THE INVENTION

It is therefore an object of the present invention to provide a DC power supply device of a relatively small size which is capable of suppressing ripples, spike voltages, and undesirable radiations in its circuit arrangement.

According to the present invention, there is provided a DC power supply device comprising a plurality of power supply blocks for supplying a plurality of voltages, each of the power supply blocks being composed of a switching circuit for being supplied with a DC voltage and a smoothing circuit connected to an output terminal of the switching circuit, the power supply blocks being mounted on a multilayer circuit board, the multilayer circuit board including a layer of a ground pattern with an electric conductor extending substantially fully thereover, the ground pattern being separated into a plurality of ground pattern portions by a plurality of recesses defined therein, the power supply blocks having respective ground terminals connected to the ground pattern portions, respectively.

Each of the recesses may be substantially horseshoe-shaped.

The multilayer circuit board may comprise at least a layer for mounting electronic parts thereon, a layer having a signal line pattern thereon, a layer having a power supply line pattern thereon, in addition to the layer of the ground pattern, and a plurality of insulating layers electrically separating and mechanically joining the layers.

Even if switching signals applied to the switching circuits have a high frequency, ripples, spike voltages, and undesirable radiations in the power supply blocks are prevented from interfering with each other, and also from adversely affecting signal lines and other circuits.

Furthermore, capacitors are equivalently formed between the patterns on the layers, and serve as filters for reducing ripples, spike voltages, and undesirable radiations in the power supply blocks, which are therefore further prevented from adversely affecting signal lines and other circuits.

The above and other objects, features, and advantages of the present invention will become apparent from the following description of an illustrative embodiment thereof to be read in conjunction with the accompanying drawings, in which like reference numerals represent the same or similar objects.

DETAILED DESCRIPTION OF THE PREFERRED EMBODIMENT

Figure 1:
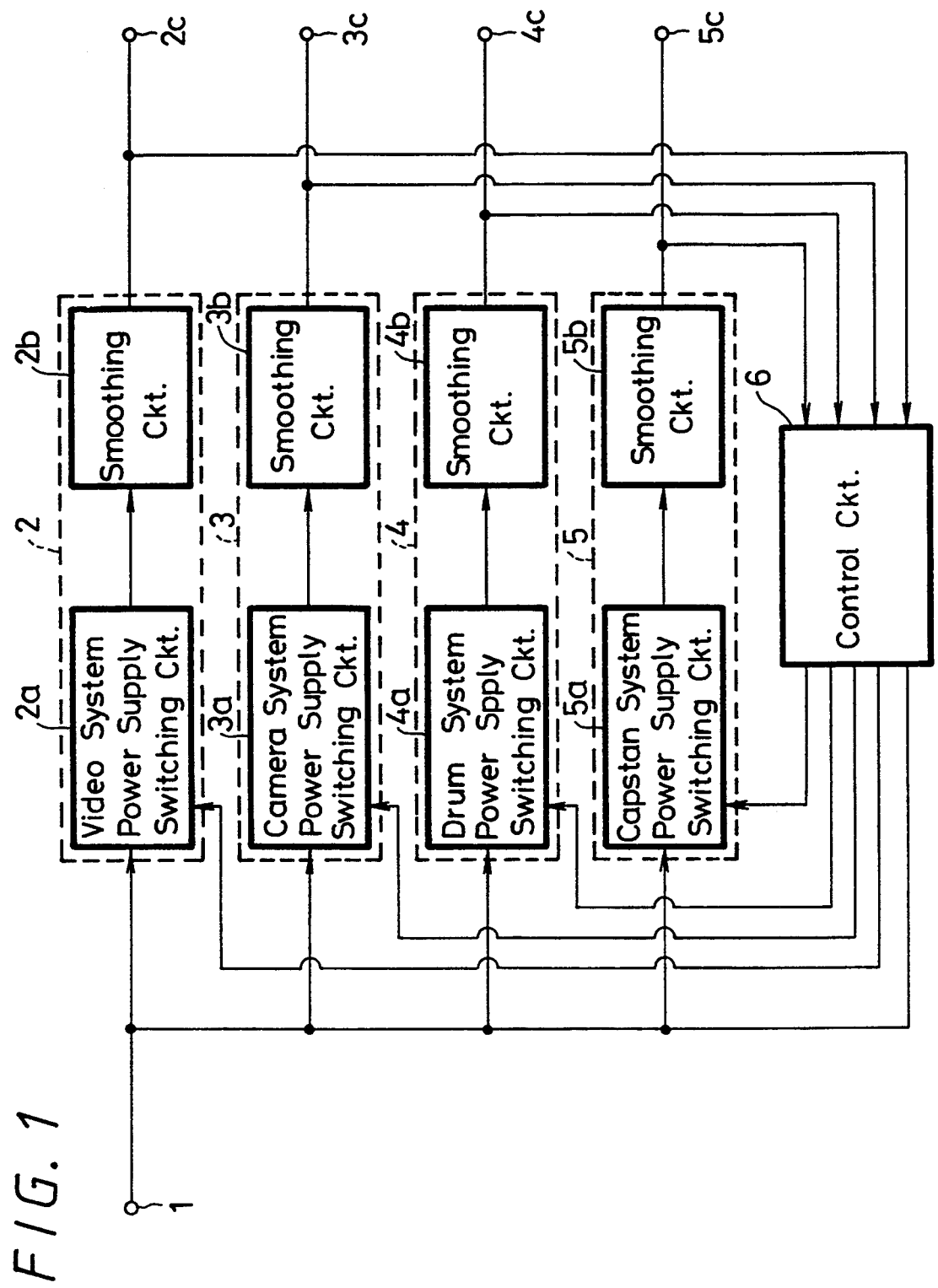
FIG. 1 is a block diagram of a circuit arrangement of a conventional DC power supply device.

A DC power supply device according to the present invention has a circuit arrangement which is essentially the same as the circuit arrangement shown in FIG. 1. More specifically, the circuit arrangement of the DC power supply device according to the present invention comprises four power supply blocks 2, 3, 4, 5 having respective switching circuits 2a, 3a, 4a, 5a for turning on and off DC voltages from an input terminal 1 with pulse-width-modulated switching signals from a control circuit 6, and respective smoothing circuits 2b, 3b, 4b, 5b connected to respective output terminals of the switching circuits 2a, 3a, 4a, 5a. The four power supply blocks 2, 3, 4, 5 produce DC voltages of 5 V, 9 V, 1.5 V, 2 V, respectively, and apply them to respective output terminals 2c, 3c, 4c, 5c.

Figure 2:
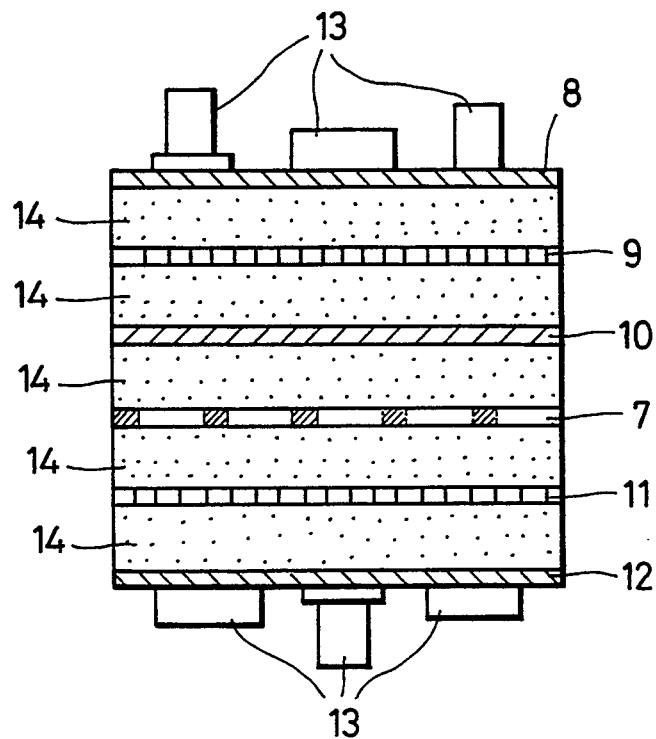
FIG. 2 is a cross-sectional view of a six-layer circuit board of a DC power supply device according to the present invention.

The DC power supply device whose circuit arrangement is shown in FIG. 1 is composed of a six-layer circuit board as shown in FIG. 2.

The six-layer circuit board as shown in FIG. 2 comprises a first layer 8 for mounting electronic parts 13 thereon, a second layer 9 of a signal line pattern of electric conductors thereon, a third layer 10 of a power supply line pattern of electric conductors thereon, a fourth layer 7 of a ground pattern with an electric conductor 7a (see FIG. 3) extending substantially fully thereover, a fifth layer 11 of a signal line pattern of electric conductors thereon, and a sixth layer 12 for mounting electronic parts 13 thereon. The first and sixth layers 8, 12 are disposed on opposite surfaces, respectively, of the six-layer circuit board. The first, second, third, fourth, fifth, and sixth layers 8, 9, 10, 7, 11, 12 are electrically separated and mechanically joined by insulating layers 14.

Figure 3:
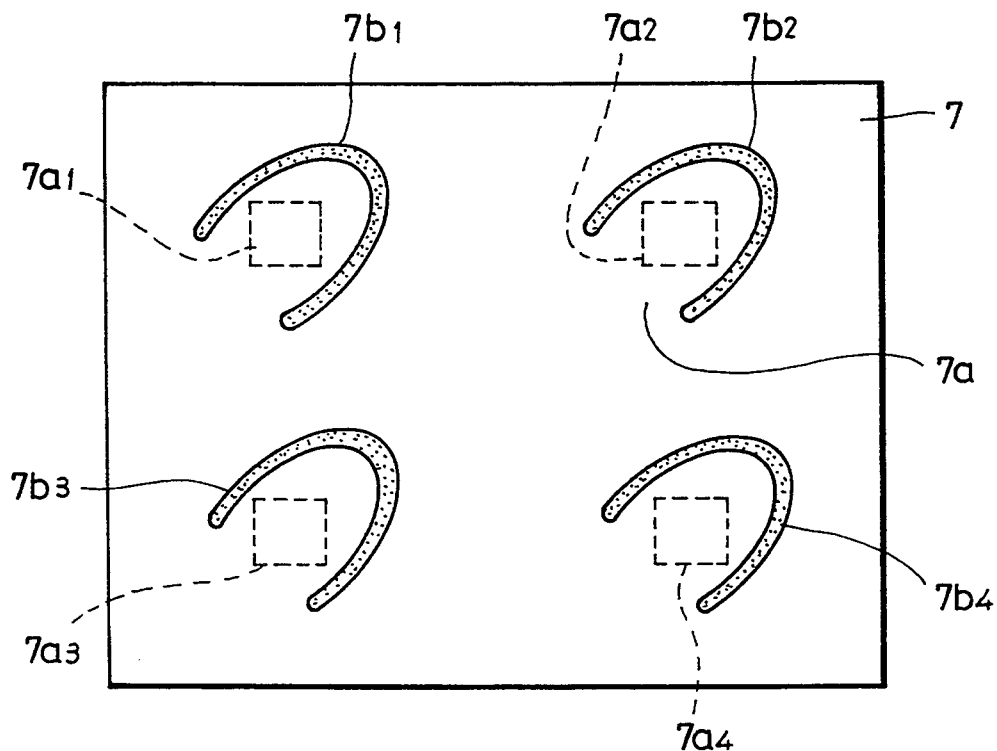
FIG. 3 is a plan view of a ground pattern layer of the DC power supply device according to the present invention.

As shown in FIG. 3, the electric conductor 7a of the ground pattern layer 7 has four substantially horseshoe-shaped recesses $7b_1$, $7b_2$, $7b_3$, $7b_4$ defined therein, thus removing horseshoe-shaped conductor segments from the electric conductor 7a. As a result, the ground pattern is separated into four portions $7a_1$, $7a_2$, $7a_3$, $7a_4$ surrounded by the respective substantially horseshoe-shaped recesses $7b_1$, $7b_2$, $7b_3$, $7b_4$.

The switching circuit 2a and the smoothing circuit 2b of the video system power supply block 2 have respective ground terminals connected via through holes defined in the insulating layer 14 to the ground pattern portion $7a_1$.

The switching circuit 3a and the smoothing circuit 3b of the camera system power supply block 3 have respective ground terminals connected via through holes defined in the insulating layer 14 to the ground pattern portion $7a_2$.

The switching circuit 4a and the smoothing circuit 4b of the drum system power supply block 4 have respective ground terminals connected via through holes defined in the insulating layer 14 to the ground pattern portion $7a_3$.

The switching circuit 5a and the smoothing circuit 5b of the capstan system power supply block 5 have respective ground terminals connected via through holes defined in the insulating layer 14 to the ground pattern portion $7a_4$.

To reduce the size of the DC power supply device, the switching signals supplied from the control circuit 6 to the switching circuits 2a, 3a, 4a, 5a have a high frequency ranging from 1 MHz to 1.2 MHz.

As described above, the DC power supply device according to the present invention is composed of a six-layer circuit board with the fourth layer comprising a ground pattern layer 7 with the electric conductor 7a extending fully over its entire surface. The ground pattern portions $7a_1$, $7a_2$, $7a_3$, $7a_4$ to which the respective ground terminals of the four power supply blocks 2, 3, 4, 5 are connected are separated by the respective horseshoe-shaped recesses $7b_1$, $7b_2$, $7b_3$, $7b_4$. Therefore, even if the switching signals have a high frequency ranging from 1 MHz to 1.2 MHz, ripples, spike voltages, and undesirable radiations in the power supply blocks 2, 3, 4, 5 are prevented from interfering with each other, and also from adversely affecting signal lines and other circuits.

Furthermore, capacitors are equivalently formed between the signal lines patterns on the second and fifth layers 9, 11, the power supply line pattern on the third layer 10, and the ground pattern on the fourth layer 7. Such capacitors serve as filters for reducing ripples, spike voltages, and undesirable radiations in the power supply blocks 2, 3, 4, 5, which are therefore further prevented from adversely affecting signal lines and other circuits.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. A DC power supply device comprising:

a plurality of power supply blocks for supplying a plurality of voltages, each of said power supply blocks being composed of a switching circuit for being supplied with a DC voltage and a smoothing circuit connected to an output terminal of said switching circuit;

said power supply blocks being mounted on a multilayer circuit board, said multilayer circuit board including a layer of a ground pattern with an electric conductor extending substantially fully thereover, said ground pattern being separated into a plurality of ground pattern portions by a plurality of recesses defined therein, said power supply blocks having respective ground terminals connected to said ground pattern portions, respectively.

2. A DC power supply device according to claim 1, wherein each of said recesses is substantially horseshoe-shaped.

3. A DC power supply device according to claim 1, wherein said multilayer circuit board comprises at least a layer for mounting electronic parts thereon, a layer having a signal line pattern thereon, a layer having a power supply line pattern thereon, in addition to said layer of the ground pattern, and a plurality of insulating layers electrically separating and mechanically joining said layers.

* * * * *